MAGNETIC AMPLIFIER CIRCUIT

Filed May 18, 1956 3 Sheets-Sheet 1

INVENTOR.
LYELL J. McDONALD
BY
Maurice A. Weikart
ATTORNEY

INVENTOR.
LYELL J. McDONALD
BY
Maurice A. Weikart
ATTORNEY

July 7, 1959 L. J. McDONALD 2,894,198

MAGNETIC AMPLIFIER CIRCUIT

Filed May 18, 1956 3 Sheets-Sheet 3

*INVENTOR.*
LYELL J. McDONALD
*BY*
Maurice A. Weikart
ATTORNEY

United States Patent Office 2,894,198

Patented July 7, 1959

2,894,198

MAGNETIC AMPLIFIER CIRCUIT

Lyell J. McDonald, Elkhart, Ind., assignor to Penn Controls Incorporated, Goshen, Ind., a corporation of Indiana Application May 18, 1956, Serial No. 585,728

5 Claims. (Cl. 323—89)

In the selection of a magnetic amplifier circuit to perform a control function, a fundamental problem is to provide a high gain amplifier with the minimum of circuit components. As is well known in the art, one method of increasing the gain is to regeneratively feed back to the control input of the amplifier some component of the load output. Such positive feedback results in increased gain but causes decreased stability of the amplifier. Any shifts in the circuit parameters such as supply voltage or frequency variations are magnified in their effects on the amplifier output.

If the feedback component is degeneratively coupled to the amplifier, so that its saturating effect opposes the saturating effect of the control winding, stability of the amplifier will be greatly increased but response time and gain will be correspondingly decreased.

An object of the present invention is to provide a high gain, stable magnetic amplifier in which the degenerative feedback effect is masked, or reduced, upon response of the amplifier to control signal variations, thus providing relatively high gain, and the degenerative effect is unmasked, or increased, upon response of the amplifier to variations in supply voltage or frequency, thus providing improved stability.

A further object is to provide a magnetic amplifier in which dual saturable reactor elements are operated differentially in response to control signal variations and in which a decreased, or masked, degenerative feedback effect modifies the response of the amplifier to differential variations in the saturation of the reactor elements and an increased, or unmasked, degenerative feedback effect modifies the response of the amplifier to non-differential variations in the saturation of the reactor elements.

A further object is to provide a stable, high-gain magnetic amplifier which is particularly adaptable to the control of temperature in refrigerated railway freight cars, because of the relatively wide variations in supply voltage and frequency encountered in such applications.

A further object is to provide a magnetic amplifier control for a dual load, such as heating and cooling means, in which the magnitude of the control signal required to provide the operating differential for the dual load elements is maintained relatively constant independently of voltage and frequency variations in the power supply to the amplifier.

These and other objects of the present invention will be made clear by reference to the following specification in which.

Figure 1:
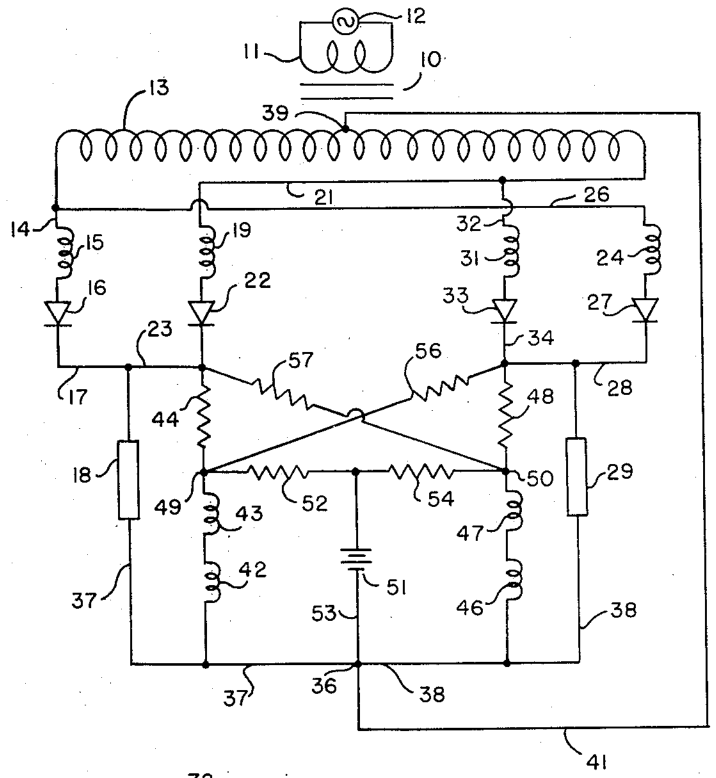
Figure 1 is a simplified, schematic diagram of an amplifier embodying the present invention.

Referring initially to Figure 1 reference numeral 10 refers to a transformer having a primary winding 11, energized from a suitable source of power 12, and a secondary winding 13. A conduit 14 connects one end of transformer secondary 13 to a load winding 15, which in turn is connected to a rectifier 16, poled in the direction shown in the drawing. A conduit 17 joins the rectifier 16 to a load element 18, which may be an electromagnetic operator for switching equipment controlling a heating and cooling means, as will be further explained with reference to Figure 4. A load winding 19 is connected by wire 21 to the other end of secondary 13 and to a rectifier 22, which is connected by wire 23 to wire 17.

A load winding 24 is connected by a wire 26 to the first mentioned end of secondary 13. Its accompanying rectifier 27 is connected by a wire 28 to a load element 29, similar to the load element 18. A load winding 31 is connected to the other end of secondary 13 by a wire 32. Its accompanying rectifier 33 is connected by a wire 34 to the wire 28.

Load element 18 and load element 29 are connected to a terminal 36 by wire 37 and 38 respectively, and terminal 36 is, in turn, connected to a center tap 39 on transformer secondary 13 by a wire 41. Two biasing windings 42 and 43 and a resistor 44 are serially connected in parallel across the load element 18. Similarly, biasing windings 46 and 47 and resistor 48 are serially connected in parallel with load element 29. Terminals 49 and 50 are interposed between resistor 44 and winding 43 and between resistor 48 and winding 47, respectively. A biasing voltage source 51 is connected via resistor 52 and wire 53 across the biasing windings 42 and 43. The source 51 is similarly connected across biasing windings 46 and 47 by means of resistor 54 and wire 53. A resistor 56 connects wire 34 with terminal 49, and, similarly, a resistor 57 connects wire 23 and terminal 50.

Control or signal windings 61, 62, 63, and 64 are connected across the output terminals 66 and 67 of a bridge circuit which is composed of fixed resistors 68 and 69 and temperature responsive resistors 71 and 72 (which may be negative temperature coefficient resistors conventionally referred to as thermistors). A suitable source of power 73 is connected across the input terminals 78 and 79 of the bridge.

Figure 2:
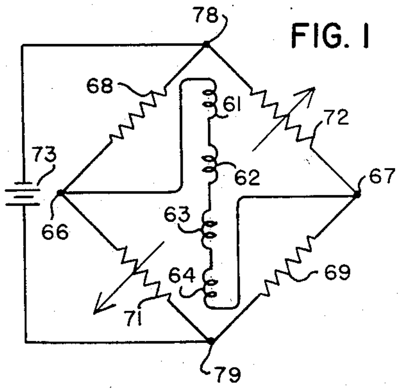
Figure 2 is a schematic illustration of the arrangement of the amplifier windings on a toroidal core.
Figure 2:
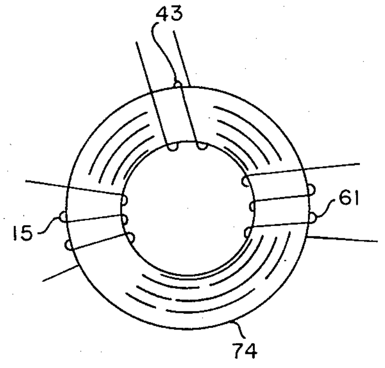
Figure 3:
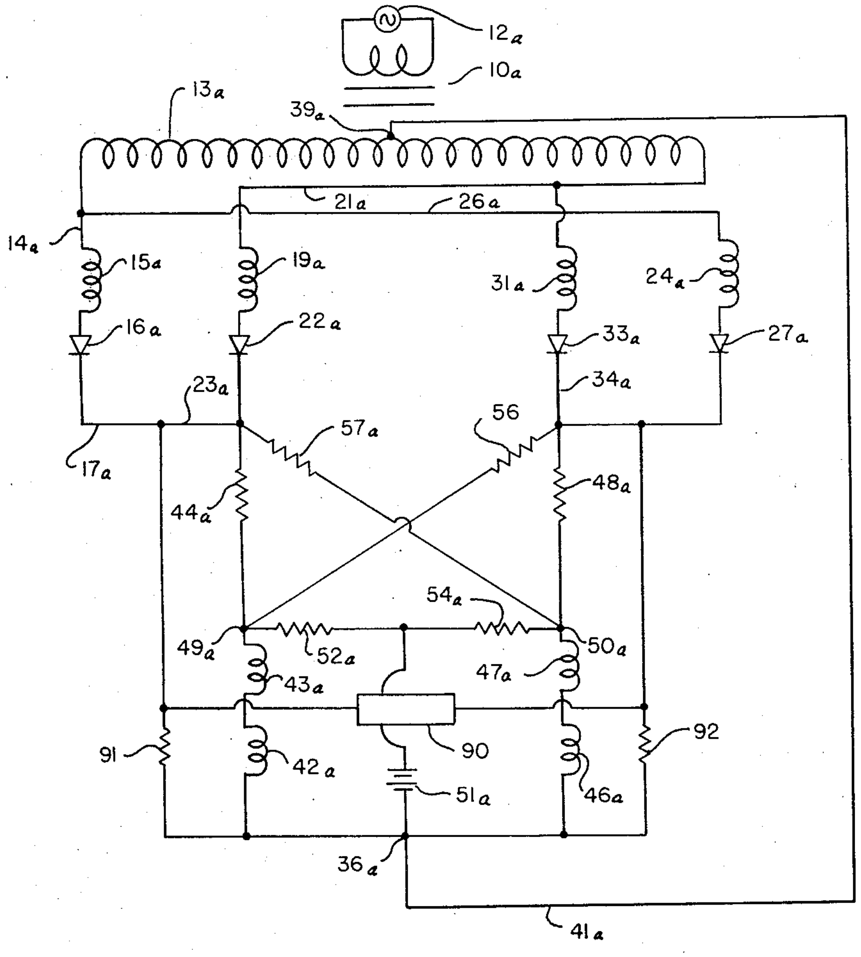
Figure 3 is a schematic diagram of the amplifier of Figure 1 modified for push-pull operation but retaining the features of the present invention.

As is illustrated in Figure 2, it will be understood that each of the load windings, biasing windings, and control windings are disposed on one of four identical cores which may be toroidal in form. As shown in Figure 3, load winding 15, biasing winding 43, and control winding 61 are all associated with core 74. Similarly load winding 19, biasing winding 42 and control winding 62 are associated with a single toroidal core, as are load winding 31, biasing winding 47, and control winding 63, and load winding 24, biasing winding 46, and control winding 64.

From the foregoing it will be understood that there has been described, generally, a full-wave, center-tapped, self saturating magnetic amplifier circuit in which power is supplied to load element 18 alternately through load winding 15 or 19, depending on the alternation of the voltage supplied by source 12, and similarly power is supplied to load element 29 alternately through load windings 31 and 24. Further it will be apparent that the control windings 61 and 62, associated with load windings 15 and 19, and control windings 63 and 64, associated with load windings 31 and 24, are oppositely poled so that a change in signal voltage appearing at the output terminals 66 and 67 of the bridge network will, through the control windings, produce a change in one sense in the saturation level of the cores associated with load windings 15 and 19 and a corresponding saturation level change in the opposite sense in the cores associated with load windings 31 and 24.

It will additionally be understood that the biasing windings 43 and 42 are associated with load windings 15 and 19, respectively, so as to oppose a change in the load current alternately carried by wires 17 and 23. Similarly biasing windings 47 and 46 are associated with load windings 31 and 24, respectively, so as to oppose a change in the load current alternately carried by wires 34 and 28. The component of the total energization of the biasing windings supplied by biasing source 51 fixes the control characteristic at the desired point with respect to zero signal voltage as is conventional. However, it will be noted that the energization of the biasing windings, or the potential appearing at terminals 49 and 50, is the result of two additional components. Referring to biasing windings 43 and 42, these additional components are provided by the current through resistor 44 and the current through resistor 56. In the case of biasing windings 47 and 46 they are provided by the current through resistors 48 and 57.

In operation, with the circuit energized in a zero signal state, if a change in the resistance of resistors 71 and 72 produces a signal voltage at the bridge output terminals 66 and 67, current will flow through controls windings 61, 62, 63, and 64. Assuming the direction of current flow through the control windings is such as to increase the saturation level of the reactors associated with load windings 15 and 19 and to, therefore, decrease the saturation level of the reactors associated with load windings 31 and 24, the result will be an increased load current through load element 18 and a correspondingly decreased load current through load element 29.

Because of the increased voltage across load element 18, the potential of terminal 49 (and consequently the current through biasing windings 43 and 42) will tend to rise. This rise in potential of terminal 49 will, however, be limited, or masked, by the corresponding potential drop introduced through resistor 56, reflecting the drop in potential across load element 29 caused by the original signal voltage change. Thus, on a signal voltage change which increases the voltage across load element 18 and correspondingly decreases the voltage across load element 29, the degenerative feedback effect introduced through resistor 44 will, depending upon the relative size of resistors 44 and 56, be over-compensated for, wiped out, or partially compensated by the circuit through resistor 56.

For signal voltage changes in the opposite direction, producing an increased voltage across load element 29 and a correspondingly decreased voltage across load element 18, it will be understood that the same characteristics will remain, that is, the degenerative feedback effect introduced through resistor 48 will be limited, or masked, by the corresponding decrease in current through resistor 57.

From the foregoing it will be seen that, in the circuit described, for changes differentially affecting the current through the two load elements the degenerative feedback effect is effectively masked and the decreased gain which accompanies the conventional use of degenerative feedback is consequently reduced.

Upon changes which affect the voltage across the two load elements in the same direction, rather than differentially, however, the stabilizing effect of the degenerative feedback becomes apparent. If there should be an unwanted increase in voltage or frequency at the voltage source 12, one result will be a corresponding increase in the voltage across both load elements 18 and 29 and, consequently, an increased load current on both sides of the amplifier. In this event the resulting increase in current through resistor 44 and the resulting increased current through resistor 56 are additive, biasing windings 43 and 42 are therefore energized at a higher level than would be the case if the cross-over connection through resistor 56 were not present, and the load current change opposing effect of biasing windings 43 and 42 tends to reduce the effect of source voltage variations on the load current. It will be apparent that on a supply voltage increase this improved stabilizing effect is similarly exerted by biasing windings 47 and 46 on the load current through load element 29 because of the increased current flow through resistors 57 and 48. The cross-over network comprising resistors 57 and 56 thus provide a reduced gain-destroying degenerative feedback effect as to changes which differentially effect the output of the two pairs of load windings and provide an accentuated degenerative feedback effect, and therefore improved stability for changes, such as supply voltage or frequency variations, which affect the output of both pairs of load windings in the same direction. It will be understood that separate feedback windings could be used leaving the biasing windings to perform only their customary function of fixing the control characteristic with respect to the zero signal axis, in this event the stabilized, high gain effect, referred to above, would yet be present.

Referring now to Figure 3 there is shown a circuit similar in most respects to the circuit of Figure 1, differing in that the single load element 90 is connected in a conventional manner to provide push-pull operation of the amplifier. Circuit elements which perform the same function as in Figure 1 retain the same reference numeral with the addition of suffix *a*. Single load element 90 and ballast resistors 91 and 92 are the only additional elements in the circuit. Control windings and their signal voltage generating means are omitted in Figure 3, to simplify the disclosure. It will be understood, however, that they may take a form identical to the bridge network and control windings 61, 62, 63, and 64 of Figure 1.

From the explanation made in regard to Figure 1, it will be evident that the effect of the cross-over network of resistors 57*a* and 56*a* remains the same, that is, for changes, such as signal voltage changes which differentially affect the outputs of the two sides of the amplifier, the degenerative feedback effect introduced through resistors 44*a* and 48*a* is masked by the cross-over connection through resistors 56*a* and 57*a*. The change in voltage across load element 90 caused by a signal voltage change is opposed (depending on the relative sizing of resistors 44*a* and 56*a* and resistors 48*a* and 57*a*, respectively) to a reduced extent because of the cross-over connections through resistors 56*a* and 57*a*. As was pointed out with respect to Figure 1, for changes which affect both sides of the amplifier in the same direction, such as supply voltage or frequency variations, the opposition to the resulting change in voltage across load element 90 is increased by the cross-over network of resistors 56*a* and 57*a*.

The high gain, supply voltage and frequency stable amplifier described in regard to Figures 1 and 3 finds particular application in the control of temperature in mechanically refrigerated railway freight cars. These cars are conventionally powered by individual diesel-driven generators supplying 230 volt 60 cycle A.C. power to operate a motor driven compressor for cooling and to energize appropriately sized electric heaters for heating. The temperature within the car must be maintained within close limits over a wide temperature range while the car is subject to ambient temperatures which may vary from −40° F. to 125° F. This accurate control must be maintained in face of output voltage variations from the individual generators of the order of twenty percent, and frequency variations of the order of thirty-three percent. At Figure 4 is shown a circuit which is an adaptation of the circuit of Figure 1, embodying the present invention and particularly suited for the control of refrigerated railway cars.

Figure 4:
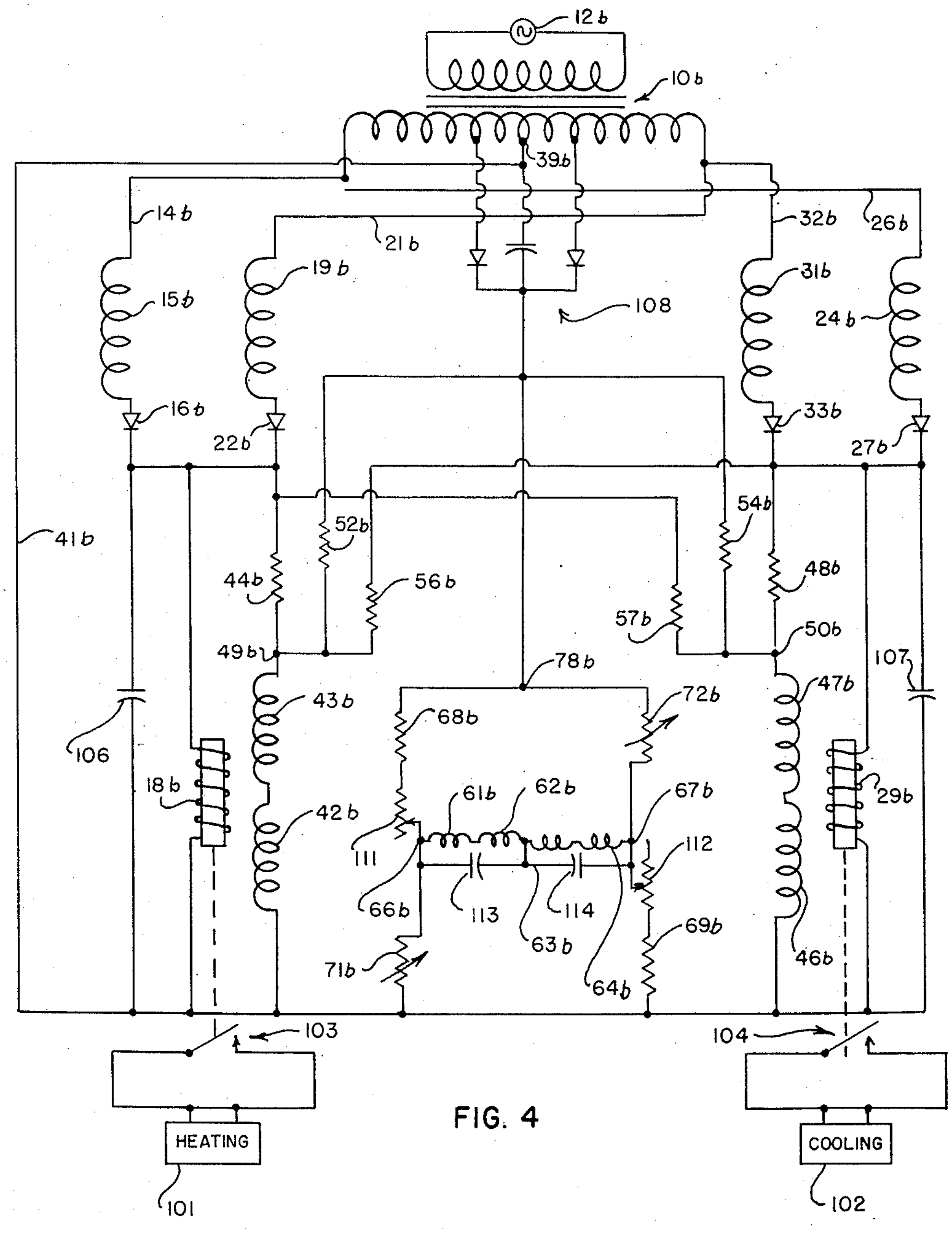
Figure 4 is a circuit diagram for an amplifier of the type shown in Figure 1 but adapted for the control of temperature in a refrigerated enclosure such as a refrigerated railway car.

Referring to Figure 4, circuit elements which find their counterparts in Figure 1 are given the same reference numerals there used with the suffix *b*. At 101 and 102 are schematically shown a heating means and cooling means, respectively, which, it will be understood, are not shown in detail since they form no part of the present invention, but which may embody the electrical heaters and mechanical refrigeration unit previously referred to. Heating means 101 is shown to be controlled by an electromagnetically operated switch 103 whose magnetic operator is the element **18*b* which is the counterpart of load element 18 in Figure 1. Similarly, cooling means 102 is controlled by a switch 104 whose magnetic operator is the element 29*b* which is the counterpart of load element 29 of Figure 1. Inspection of the circuit of Figure 4 will establish that in general form the circuit is the same as that of Figure 1. Filtering condensers 106 and 107 are added across load elements 18*b* and 29*b*, respectively, and a full wave rectifying network indicated generally by reference numeral 108 supplies D.C. power to biasing windings 43*b*, 42*b*, 47*b*, and 46*b* in place of the battery 51** of Figure 1.

The temperature sensing bridge network comprising resistors **71*b*, 68*b*, 72*b*, and 69*b* and control windings 61*b*, 62*b*, 63*b*, and 64*b* is shown in somewhat different form but functionally is the same as the bridge network shown in Figure 1. Adjustable resistors 111 and 112 are added to two arms of the bridge to provide a means for setting the control point of the system, it being understood that manual means may be provided for moving the wiper arms of the resistors 111 and 112 in unison and in opposing direction to set the adjusted balancing point for the bridge network. Control windings 61*b*, 62*b*, 63*b*, and 64*b* are connected across the output terminals of the bridge network and utilize bypass condensers 113 and 114** in conventional fashion.

In operation the circuit of Figure 4 is the same as that of Figure 1. When a rise in temperature is sensed by the bridge network a resulting voltage will appear across its output terminals in a direction which will cause control windings **63*b* and 64*b* to increase the saturation level of the reactor elements associated with load windings 31*b* and 24*b*, and cause control windings 61*b* and 62*b* to decrease the saturation level of the reactor elements associated with load windings 15*b* and 19*b*. The resulting increase in output of the amplifier will be accompanied, of course, by a corresponding decrease in the output of the heating side of the amplifier, and assuming the increase in voltage across electromagnetic coil 29*b* is large enough; 29*b* will move to energized position, closing switch 104 and starting the cooling means. The same sequence, involving element 18*b***, however, occurs when the bridge network senses a temperature variation calling for operation of the heating means.

As was pointed out with regard to Figures 1 and 3, with control signal variations which differentially affect the outputs of the heating and cooling side of the circuit, the degenerative feedback effect provided through resistors **44*b* and 48*b* is opposed, or masked, by the opposing effect provided through resistors 56*b* and 57*b*. With changes which affect the heating and cooling sides of the circuit in the same direction, such as supply voltage variations, the degenerative feedback effect provided through resistors 44*b* and 56*b* or 48*b* and 57*b* serves to reduce the change in output to elements 18*b* and 28*b*** with a given change in supply voltage.

From the foregoing it will be seen that there is herein described a high-gain amplifier having particular stability to supply voltage or frequency variations, well suited for use in the temperature control of refrigerated railway cars, the advantages of the circuit being adaptable to various amplifier configurations and various reactor winding arrangements.

The foregoing has described preferred embodiments of the invention, modifications may occur to those skilled in the art and it is to be understood that the scope of the present invention is to be limited only by the appended claims.

What is claimed is:

1. A stabilized magnetic amplifier system comprising a pair of magnetic amplifier elements each including a saturable reactor element, each of said amplifier elements having a load winding, control winding and an output circuit, said control windings being connected for differential operation of said amplifier elements, an additional winding for each of said amplifier elements connected in the output circuit thereof and degeneratively coupled to its corresponding amplifier element, and means for controlling the level of energization of each of said additional windings as a function of the sum of the outputs of both of said amplifier elements, said last mentioned means comprising a cross-over circuit network connecting each of said additional windings with the output circuit of said other magnetic amplifier element.

2. A stabilized magnetic amplifier system comprising a pair of magnetic amplifier elements each including saturable reactor elements, each of said amplifier elements having a load winding and an output circuit, an additional winding for each of said amplifier elements connected in the output circuit thereof and degeneratively coupled to its corresponding amplifier element, and means for controlling the level of energization of each of said additional windings as a function of the algebraic sum of the outputs of both of said amplifier elements, said last mentioned means comprising a pair of resistors one of which is connected between each of said additional windings and the output circuit of the other magnetic amplifier element.

3. A magnetic amplifier system comprising dual magnetic amplifier elements each having a saturable reactor element, a load winding circuit network and control means, said control means being adapted to differentially control the degree of saturation of said reactor elements, said control means including a winding degeneratively associated with each of said amplifier elements, and circuit means interconnecting each of said last mentioned windings with the load winding networks of both amplifier elements to retard the change in energization level of each of said last mentioned windings upon a differential change in the degree of saturation of said reactor elements caused by said control means and to accentuate the change in energization level of each of said last mentioned windings upon a non-differential change in the degree of saturation of said reactor elements.

4. A magnetic amplifier system comprising a pair of self-saturating magnetic amplifiers each having a full-wave D.C. output, control means for said amplifiers including control windings for differentially controlling the output of said amplifiers, an additional winding associated with each of said magnetic amplifiers degeneratively energized by the output of its associated amplifier and a cross-over circuit network connecting each of said additional windings to the output of its non-associated amplifier.

5. A magnetic amplifier system comprising a pair of self-saturating magnetic amplifiers each having a full-wave D.C. output and a load energized thereby, control means for said amplifiers for differentially controlling the output of said amplifiers, an additional winding for each of said amplifiers connected in parallel with the load of its respective amplifier and degeneratively energized by the output thereof, and a cross-over circuit network connecting each of said additional windings to the output of the other amplifier.

References Cited in the file of this patent

UNITED STATES PATENTS

| | | |
|---|---|---|
| 2,595,644 | Davis | May 6, 1952 |
| 2,700,128 | Woerdmann | Jan. 18, 1955 |
| 2,729,779 | Milsom | Jan. 3, 1956 |
| 2,734,165 | Lufay et al. | Feb. 7, 1956 |
| 2,765,374 | Louden | Oct. 2, 1956 |

FOREIGN PATENTS

| | | |
|---|---|---|
| 717,977 | Great Britain | Nov. 3, 1954 |

OTHER REFERENCES

Publication, "The Transductor Amplifier" by Ulirk Krabbe, pages 63 to 71. Published in Sweden, 1947.